United States Patent [19]
Huang

[11] Patent Number: 5,675,270
[45] Date of Patent: Oct. 7, 1997

[54] DATA LINE WITH DYNAMIC PULL-UP CIRCUIT

[75] Inventor: Chih-Tsung Huang, Burlingame, Calif.

[73] Assignee: Xilinx, Inc., San Jose, Calif.

[21] Appl. No.: 593,986

[22] Filed: Jan. 30, 1996

[51] Int. Cl.[6] .................................................. H03K 1/00
[52] U.S. Cl. ................................................. 327/108; 327/379
[58] Field of Search ........................................ 327/134, 170, 327/108, 109, 111, 112, 379–383, 427, 374, 205, 206; 326/26, 27

[56] References Cited

U.S. PATENT DOCUMENTS

| | | | |
|---|---|---|---|
| 5,306,965 | 4/1994 | Asprey | 327/108 |
| 5,402,081 | 3/1995 | Wong et al. | 327/379 |
| 5,488,322 | 1/1996 | Kaplinsky | 327/108 |
| 5,539,341 | 7/1996 | Kuo | 327/108 |

*Primary Examiner*—Toan Tran
*Attorney, Agent, or Firm*—Haynes & Davis; Carr, DeFilippo & Ferrell; Jeanette S. Harms

[57] ABSTRACT

A data line for an integrated circuit such as field programmable gate array, has a relatively fast rise time, consumes relatively low amount of current, and maintains a relatively fast fall time. A data conductor is connected to a circuit element providing a current path from the data conductor to a source of the supply voltage. A plurality of data-in drivers are connected to the data conductor which act in one state to pull the data conductor from the supply voltage to ground, and act in another state to present high impedance to the data conductor. A dynamic element is included, which connects an additional current path between the data line and the supply during transitions from ground to the supply, and which disconnects the additional current path otherwise. This speeds up the transitions from low to high, while not opposing the transitions from high to low. The dynamic element comprises of p-channel transistor having a source connected to the supply source, an n-channel transistor having its drain connected to the drain of the p-channel transistor, and its source connected by a current path to the data conductor. An inverter with a low trip point having its input connected to the data conductor and its output connected to the gate of the p-channel transistor provides feedback to turn the p-channel transistor on when the data line goes high. An inverting Schmitt trigger has its input connected to the data conductor and its output connected to the gate of the n-channel transistor. The Schmitt trigger enables the feedback with a hysteresis characteristic, which has a trip point on transitions from low to high relatively high, and trip point on transitions from high to low relatively low.

15 Claims, 4 Drawing Sheets

DATA LINE WITH DYNAMIC PULL-UP CIRCUIT

BACKGROUND OF THE INVENTION

1. Field of the Invention

The present invention relates to data lines on integrated circuits, such as the long line data conductors on field programmable gate array devices, and more particularly to dynamic pull-up circuits utilized with such data lines.

2. Description of Related Art

Integrated circuits, such as field programmable gate arrays, often have long line data conductors which are driven by a number of sources of data on the chip. One common approach to providing these data lines is to connect a passive pull-up circuit to the data line, so that it normally rests at near the supply voltage. In order to drive the data line, a source of data connects a pull-down circuit to the data line, which overcomes the relatively weak passive pull-up circuit to pull the data line to ground. When no source of data is driving the data line, the data line is then pulled back up to near the supply voltage by the passive pull-up circuit.

Historically, data lines with passive pull-up circuits and pull-down circuits have been built as illustrated in prior art FIG. 1. A passive pull-up element, in this case implemented by p-channel transistor 12 having its gate connected to a bias voltage, pulls the signal on the data line 10 towards the supply voltage 13. The pull-down circuit (driver) 11 is substantially stronger than the pull-up circuit made by transistor 12, and is able to pull down the signal on the data line 10. Specifically, signal A, if active, causes the driver 11 to pull-down the signal on the data line 10 to substantially ground. The load represented by buffer 14 tends to slow down signal transitions on the data line 10. Typically, the rise time of the data line 10 depends on the size of the transistor 12. Specifically, the larger the transistor 12, the faster the rise time. Unfortunately, as transistor 12 is increased in size, more DC current is consumed by the circuit, thereby slowing down the pull-down process.

Another prior art approach to pull-up circuits is illustrated in FIG. 2. In prior art FIG. 2, the basic circuit of FIG. 1 is supplemented with a dynamic feedback circuit generally composed of an inverter 15 having its input terminal connected to the data line 10 and its output terminal connected to the gate of a p-channel transistor 16. The drain of p-channel transistor 16 is connected to the data line 10, and the source is connected to the supply voltage 13. This configuration allows the transistor 12 to be smaller in size, compared with the same transistor of FIG. 1, thereby reducing DC current. For high speed applications requiring a fast rise time, the trip point of the inverter 15 is set low. However, the dynamic feedback circuit tends to oppose the data driver 11, thereby causing a slower fall time for the data line, which in turn decreases the speed of the integrated circuit utilizing the data line 10.

Accordingly, a need arises for a higher speed data line circuit, which consumes relatively small amounts of DC current; particularly for use on the long line data conductors on field programmable gate arrays.

SUMMARY OF THE INVENTION

The present invention provides a data line for an integrated circuit, which has a relatively fast rise time, consumes relatively low amounts of current, and maintains a relatively fast fall time. The data line comprises a data conductor on the integrated circuit, and a circuit element providing a current path connecting the data conductor to a source of a target voltage, such as the supply voltage for a static or undriven state. A plurality of data-in drivers are connected to the data conductor which act in one state to pull the data conductor from the target voltage (i.e. the supply voltage) to a driven voltage (i.e. ground), and act in another state to present high impedance to the data conductor. According to the present invention, a dynamic element provides an additional current path between the data line and the source of target voltage during transitions from the driven voltage to the target voltage, and which disconnects the additional current path otherwise. In this manner, the present invention speeds up the transitions from the driven voltage to the target voltage, while not opposing the transitions from the target voltage to the driven voltage. In addition to speeding up transitions, the dynamic element is used in combination with a passive element having relatively high resistance, so that DC current is reduced.

According to one aspect of the invention, the dynamic element comprises a feedback driver and a feedback enable circuit with hysteresis, thereby causing the feedback driver to be enabled when voltage on the data conductor is in transition from the driven voltage to the target voltage, and to be disabled when voltage on the data conductor is in transition from the target voltage to the driven voltage. Thus, the dynamic element works to drive the data line to the target voltage quickly after the data-in driver controlling the data line turns off. When the data line reaches the target voltage, the dynamic element turns off, thereby allowing a relatively weak passive circuit element to maintain the voltage on the data line at the target voltage. Thus, because the dynamic element remains off and does not oppose the data-in driver, when a data-in driver turns on, it pulls only against a relatively weak passive circuit element. This configuration allows relatively fast transitions both from the driven voltage to the target voltage, and from the target voltage to the driven voltage.

According to yet another aspect of the invention, the dynamic element comprises a p-channel transistor having its source connected to a source of the target voltage (a supply voltage), and an n-channel transistor having its drain connected to the drain of the p-channel transistor, and its source connected by a current path to the data conductor. An inverter having its input terminal connected to the data conductor and its output terminal connected to the gate of the p-channel transistor provides feedback to turn the p-channel transistor on when the data line goes high. The inverter has a relatively low trip point and turns on very soon after the data-in drivers turn off, and the passive circuit element begins to pull-up the data line. An inverting Schmitt trigger has its input terminal connected to the data conductor and its output terminal connected to the gate of the n-channel transistor. The Schmitt trigger has a hysteresis characteristic, which has a trip point on transitions from the driven voltage to the target voltage set relatively close to the target voltage, and a trip point on transitions from the target voltage to the driven voltage set relatively close to the driven voltage. For example, the inverter has a trip point less than one-half of the difference between the target voltage and the driven voltage (when the driven voltage is low), whereas the Schmitt trigger has a trip point for transitions from the driven voltage to target voltage at more than one-half of that value. In one preferred system, the Schmitt trigger inverter is set up with a low-to-high going trip point near the supply voltage minus one p-channel threshold voltage, and a high-to-low going trip point near ground plus one n-channel threshold voltage.

The Schmitt trigger has an inverting characteristic, such that when the voltage on the data line is low, its output signal is high, thereby enabling the n-channel transistor to pass current of the p-channel transistor and to respond to the feedback signal provided by the inverter. Because the Schmitt trigger has its trip point on transitions from the driven voltage to the target voltage set relatively high, the n-channel transistor will remain conductive, thereby allowing current to flow to the data line until the voltage on the data line reaches the relatively high trip point of the Schmitt trigger. When the voltage on the data line has been pulled up to the relatively high trip point, the Schmitt trigger turns off the n-channel transistor and disables the feedback driver. The feedback driver will remain disabled, even during transitions from the target voltage to the driven voltage, because the inverter has a relatively low trip point, and the Schmitt trigger has a relatively low trip point as well for transitions in that direction.

The present invention can also be characterized as a data line on an integrated circuit programmable logic device which includes a set of configurable logic blocks. In this aspect, the data-in drivers are coupled with the configurable logic blocks in the array, and the data line comprises a long line for the device.

The present invention can also be characterized as a dynamic pull-up circuit for a data line on an integrated circuit, having the characteristics discussed above.

Accordingly, the present invention provides additional control for dynamic pull-up on a data line which speeds up the rise time, during the transition from the low driven voltage to the high target voltage, but does not slow down the fall time. Advantageously, the present invention turns on only during transitional periods from low to high voltage, and at no other time. This configuration allows low DC current consumption to be minimized, by utilizing a relatively weak static pull-up element. Furthermore, the present invention allows the metal utilized in the data conductor to be relatively small, because of the relatively lower static current requirements.

The data line of the present invention is scalable with increases in array size, because a low static DC current can be utilized, while increasing the size of the dynamic pull-up to keep the static pull-up constant.

The dynamic pull-up can be distributed to various regions of the long line in the programmable gate array device. For example, the dynamic pull-up may be positioned at a number of locations along the data line, such as at two, three, or four equally spaced locations.

Finally, the user can control the window during which the dynamic feedback is enabled, to increase (wider window) or decrease (narrower window) the additional pull provided by the dynamic pull-up, thereby providing control over the transitional pull-up and pull-down speeds. This control can be provided by adjusting the trip points on the Schmitt trigger inverter used in the dynamic feedback circuit, in which wider hysteresis causes stronger dynamic pull-up.

Other aspects and advantages of the present invention can be seen upon review of the figure, the detailed description and the claims which follow.

DETAILED DESCRIPTION

Figure 1:
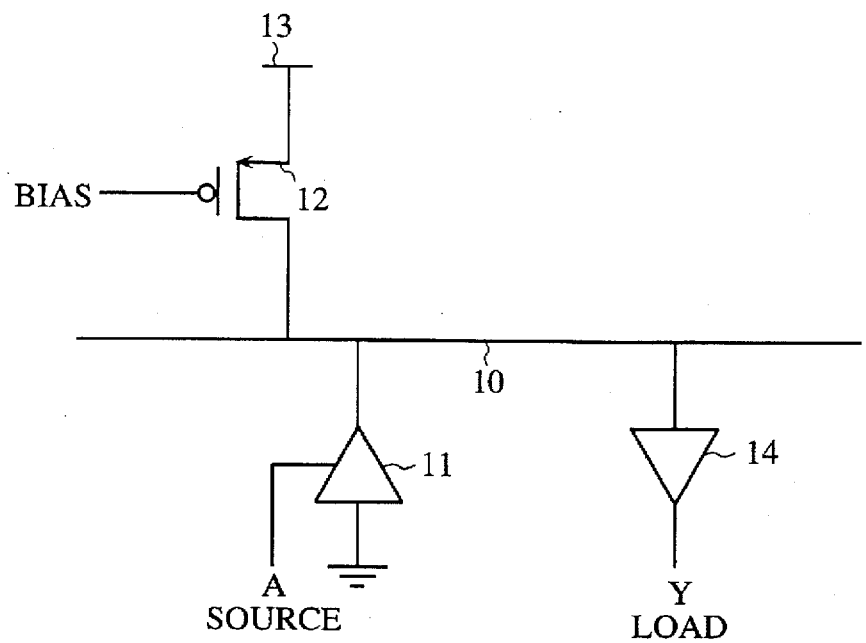
FIG. 1 is a schematic diagram of a prior art data line.
Figure 2:
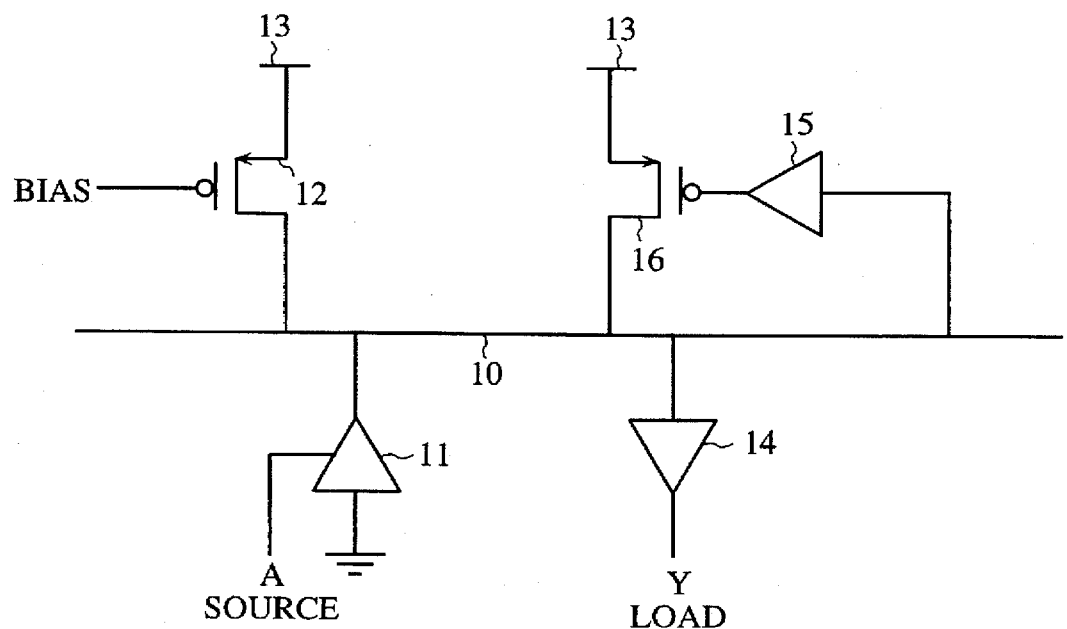
FIG. 2 is a schematic diagram of another prior art data line.
Figures 3, 4:
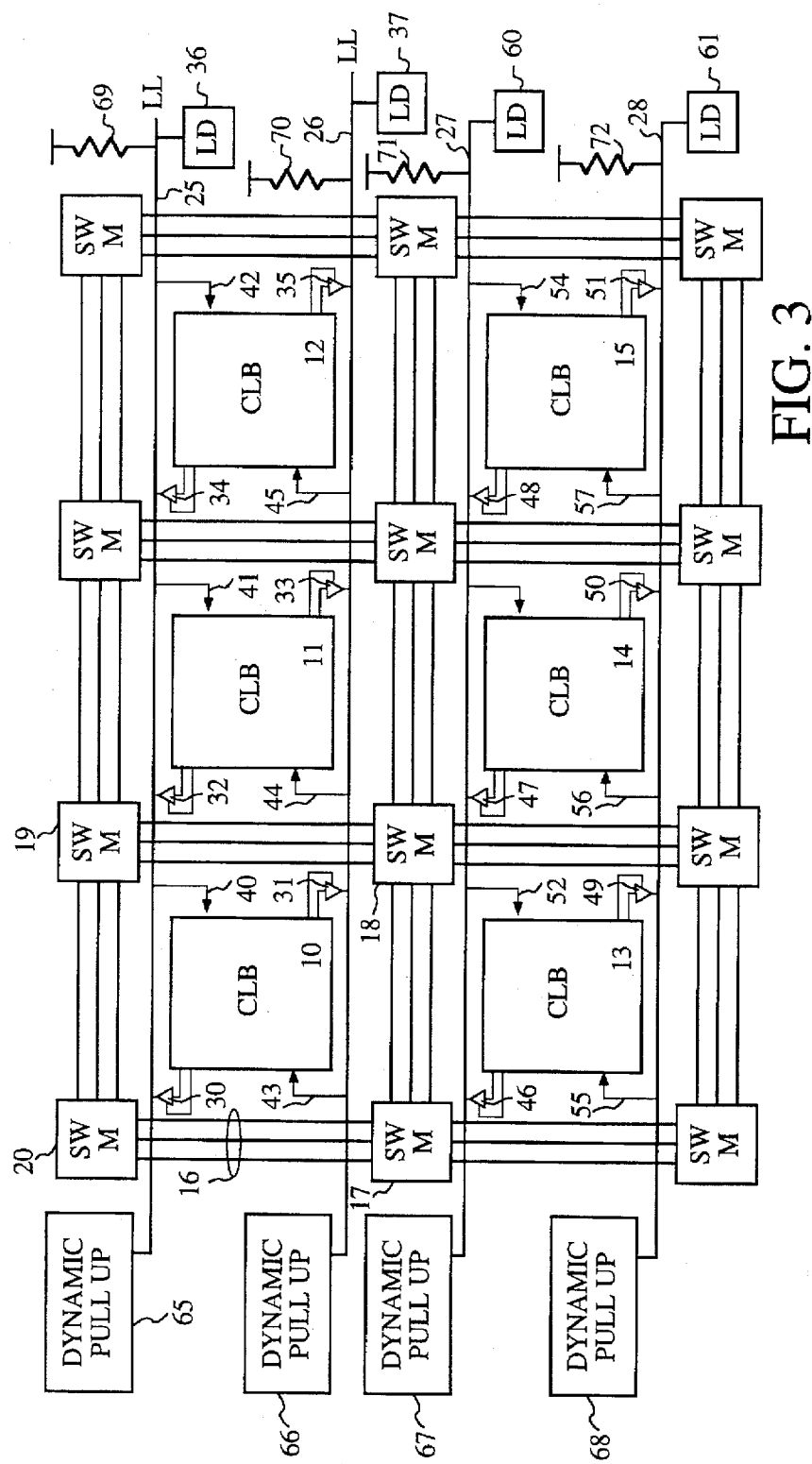
FIG. 3 is a block diagram of a field programmable gate array device including the data line of the present invention.
FIG. 4 illustrates the timing of the dynamic pull-up circuit of the present invention.

A detailed description of embodiments of the present invention is described with respect to FIGS. 3–8, in which FIG. 3 illustrates a portion of a field programmable gate array including the data lines according to the present invention. Specifically FIG. 3 shows an illustrative set of configurable logic blocks 10–15 surrounded by an interconnect structure, schematically represented by the lines (e.g. lines 16), and interconnect switch matrices, such as switch matrices 17, 18, 19 and 20. The configurable connections between the configurable logic blocks 10 and the interconnect structure lines 16 are well known in the art, and therefore are not shown for simplicity.

In the embodiment illustrated in FIG. 3, each CLB is connected to two long lines LL which extend across the array separate from the standard inter-connect structure. In this embodiment, long lines 25, 26, 27, and 28 are passively pulled up through pull-up resistors 69, 70, 71 and 72, respectively. Each long line has a load (such as load 36 on long line 25, load 37 on long line 26, load 60 on long line 27 and load 61 on long line 28) provided from, for example, input/output blocks (not shown). In order to drive data onto a long line, each configurable logic block includes a data-in driver circuit. For example, CLB 10 has driver 30 coupled to long line 25 and driver 31 coupled to long line 26; CLB 11 has driver 32 coupled to long line 25 and driver 33 coupled to long line 26; and CLB 12 has driver 34 coupled to long line 25 and driver 35 coupled to long line 26. Data is provided via the long lines into each of the CLBs, such as by the lines 40–42 coupled from long line 25 to the CLBs 10–12, respectively, and lines 43–45 coupled from long line 26 to the CLBs 10–12. CLBs 13–15 have similar connections to the long lines 27 and 28 via drivers 46–51 and lines 52–57.

In order to drive data onto the long lines, the data-in drivers are enabled to pull the long line down substantially to ground. Thus, the drivers 30–35 and 46–51 have large enough current pull to overcome the pull-up current paths through the pull-up resistors 69–72. When no driver is enabled, then the pull-up resistor pulls the long line up to the source potential. According to the present invention, dynamic pull-up circuits 65–68 are coupled to the long lines 25–28, respectively, to dynamically assist pulling up the voltage on the long line from the driven voltage to the target voltage.

FIG. 4 illustrates the timing of the dynamic pull-up provided by the dynamic pull-up circuits 65–68. Referring to trace 100, when the voltage on the long line is low, dynamic pull-ups are off. When the drivers pulling the long line low turn off, the voltage on the long line begins to increase because of the action of the pull-up resistors. When the voltage begins to increase, the dynamic pull-up circuit provides an additional current path to the source voltage increasing the rate of the pull-up operation. Thus, as indicated in FIG. 4, the dynamic pull-up begins at time 101. This dynamic pull-up continues until time 102 when the transition from the low or driven state to the high or target state is over. At time 102, the dynamic pull-up turns off. When a driver is enabled and pulls the voltage on the long line down, such as in the region 103, the dynamic pull-up circuits are not enabled and do not oppose the pull-down action of the drivers along the long line.

Figure 5:
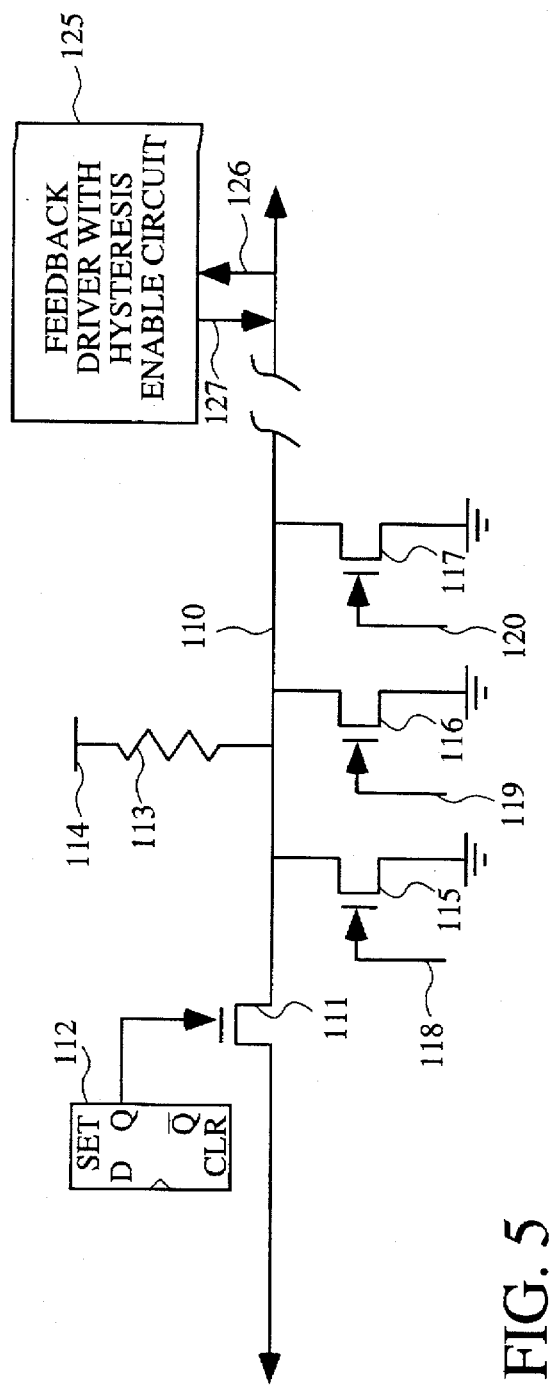
FIG. 5 is a schematic diagram of a data line according to the present invention.

FIG. 5 illustrates one embodiment of a long line, which consists of a data conductor (long line) 110 which is divided into two segments by a programmable pass transistor 111. Transistor 111 is enabled or disabled by a SRAM-based, or other programmable memory based, configuration bit, represented by the register 112 in FIG. 5. In other embodiments, the long line 110 includes a plurality of such segments and pass transistors 111, wherein if all of such pass transistors are turned on, the long line 110 extends across the entire array and terminates at either end in an input/output block on the device. For each segment of long line 110 (as determined by the number of transistors 111) there is a corresponding set of static pull-ups 113 and dynamic pull-ups 125.

One or more passive pull-up circuits, as represented by resistor 113, are coupled between the long line 110 and the supply voltage 114, which is typically $V_{DD}$. The drivers of the present invention, in this embodiment represented by pull-down transistors 115, 116 and 117, provide a high impedance state to the long line 110 when in their off state. When turned on by input signals 118-120, transistors 115-117 operate to pull the voltage on the long line 110 to the driven state, which in this example is essentially ground. Thus, the transistors 115-117 in this embodiment will be stronger devices than the pull-up resistor 113. The drivers 115, 116 and 117 include CLB output buffers, SRAM cells, or other signal sources having a tri-state characteristic.

According to the present invention, in addition to the pull-up resistor 113, a feedback driver 125 with a hysteresis enable circuit is coupled to the long line 110. This feedback driver 125 is one embodiment of the dynamic elements 65, 66, 67 and 68 of FIG. 3. Thus, the voltage on the long line 110 is supplied to the feedback driver 125 via line 126, and the feedback driver 125 provides an additional current path from a supply voltage (not shown), back to the long line 110 via line 127. The feedback driver 125 is enabled by the hysteresis enable circuit (described in detail in reference to FIG. 8) only during the transitions from the low, or driven, state to the high, or target, state. When the voltage on the long line 110 goes from the target high state to the driven low state, hysteresis prevents the feedback circuit from turning on and opposing the operation of the pull-down transistors 115-117.

Figure 5A:
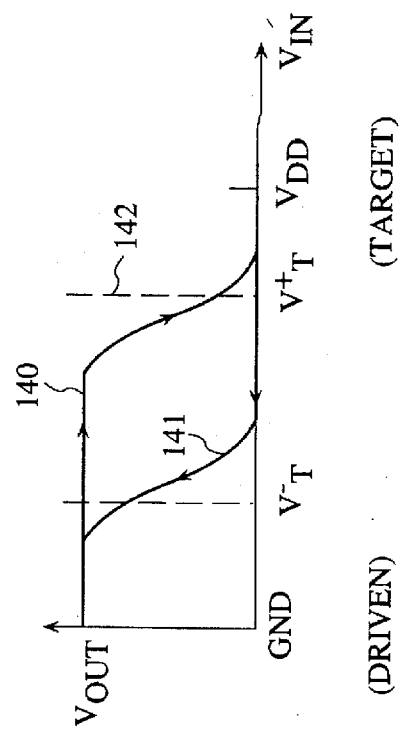
FIG. 5A shows operation of the hysteresis enable circuit of FIG. 5.

FIG. 5A illustrates the operation of the hysteresis enable circuit 125. In FIG. 5A, the horizontal axis is the input voltage, that is, the voltage on line 126. Vertical axis is the output voltage, that is, the voltage on line 127. During a transition from the low voltage to the high voltage on the input, the graph follows the path 140. During the transition from the high voltage to the low voltage on the input, the graph follows the path 141. Thus, there is a threshold $V+_T$ at point 142, which transitions from low to high, and a threshold $V-_T$ for transitions from the high voltage to the low voltage. The difference $V_H$ between the thresholds sets the width of the hysteresis window. The hysteresis enable circuit enables the dynamic feedback driver during the window $V_H$ on transitions from ground to the supply voltage, and disables the dynamic feedback driver otherwise, using a circuit such as illustrated in FIG. 6.

Figure 6:
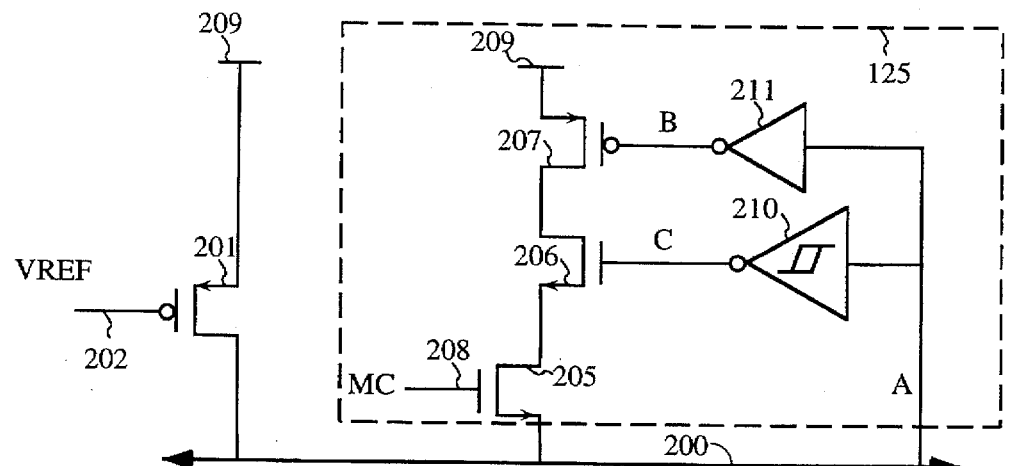
FIG. 6 is a circuit diagram for the dynamic pull-up circuit and passive pull-up circuit for the data line according to the present invention.

FIG. 6 is a circuit diagram of one embodiment of a feedback driver 125 with a hysteresis enable circuit, and a pull-up circuit. In FIG. 6, long line 200 is passively pulled up by a p-channel transistor 201 (corresponding to pull-up 113 of FIG. 5) which has its gate coupled to a reference voltage potential VREF on line 202. The reference voltage potential VREF on line 202 tends to bias the transistor 201 to an "on" state. This transistor in one embodiment is 50 microns wide by 0.8 microns long. The feedback driver 125 with the hysteresis enable includes the transistors 205, 206 and 207 in series. Transistor 205 is an n-channel transistor having its source coupled to the long line 200, its drain coupled to the source of transistor 206, and its gate coupled to a bias potential MC on line 208 such that it is conductive. Transistor 206 has its drain connected to the drain of the p-channel transistor 207. The source of p-channel transistor 207 is coupled to the supply potential at node 209. In one embodiment, the transistor 207 is 50 microns wide by 0.8 microns long, transistor 206 is 45 microns wide by 0.8 microns wide, and transistor 205 is 45 microns wide by 0.8 microns long.

The gate of transistor 206 is connected to the output terminal of an inverting Schmitt trigger 210, whereas the gate of p-channel transistor 207 is connected to the output terminal of an inverter 211. Both input terminals of inverter 211 and the Schmitt trigger 210 are connected to the long line 200.

The inverter 211 is implemented using standard techniques, with a 20 micron wide p-channel transistor which is 0.8 microns long, coupled with a n-channel 60 micron wide transistor, also 0.8 microns wide. This configuration sets a low trip point for the inverter 211 (as discussed below with reference to FIG. 7).

In accordance with the present invention, the trip point for the Schmitt trigger 210 for signal transitions from the driven voltage on the long line 200 to the target voltage is relatively low, such as less than one-half, preferably less than one-third of the difference between the driven voltage and the reference voltage. In one embodiment this trip point is set near ground plus one n-channel threshold voltage (about 0.7 V). In contrast, the trip point for the Schmitt trigger 210 for signal transitions from the target voltage to the driven voltage is relatively high, such as greater than one-half, and preferably greater than two-thirds, of the difference between the driven voltage and the target voltage. In one embodiment, this trip point is set near the supply potential minus one p-channel threshold ($V_{DD}$ minus about 1.1 V). In other embodiments, a wide variety of other hysteresis based enable circuits are utilized in lieu of the Schmitt trigger 210.

Figure 7:
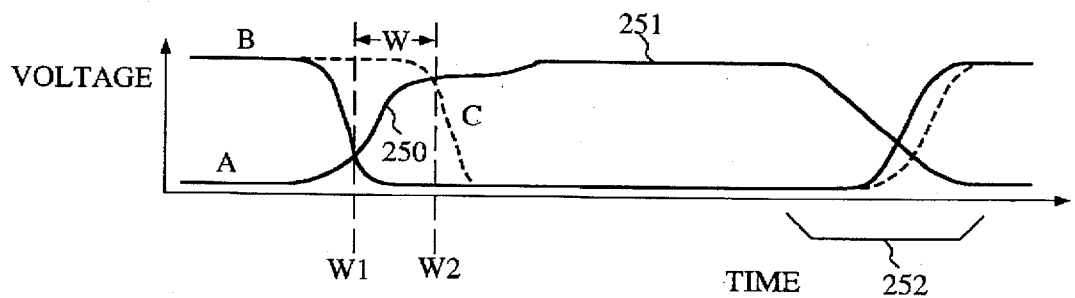
FIG. 7 is a timing diagram illustrating operation of the circuit of FIG. 6.

FIG. 7 is a timing diagram for operation of the feedback driver 125 in which signal A corresponds to the voltage on the long line 200, signal B corresponds to the voltage at the output terminal of inverter 211, and signal C corresponds to the voltage at the output terminal of Schmitt trigger 210. As can be seen in FIG. 7, at time W1, as the signal A on the long line 200 begins to rise, the signal B on the output terminal of the inverter 211 begins to fall because of relatively low trip point of the inverter 211. However, the Schmitt trigger has a relatively high trip point for this same signal transition. Thus, the signal C remains high during the transition until time W2, when the trip point of the Schmitt trigger 210 is reached.

During the window W, as illustrated in FIG. 7, the rise of the signal A on the long line 200 is fast in the region 250 of signal A, because signal B is low so transistor 207 is on, signal C is high so transistor 206 is on, and current flows from the source supply 209 through the transistors to the data line 200. This current flow speeds up the pull-up action on the data conductor 200. When the signal A on the data conductor 200 reaches the trip point of the Schmitt trigger 210, signal C falls, and turns off transistor 206, thereby disabling the feedback. When the feedback is disabled, the passive pull-up through transistor 201 continues the pull-up of the data line to the target state in region 251 of the graph.

When the voltage on the long line 200 is being pulled down by a data-in driver (i.e. one of pull-down transistors 115, 116, 117) from the target state, as illustrated in the region 252, the feedback is not enabled. Specifically, signal C is low which turns off transistor 206. Therefore, current cannot flow through the feedback path to the long line 200. As signal A on the data conductor 200 falls in the region 252, the trip point of inverter 211 is reached which raises signal B high, thereby turning off transistor 207. When the trip point of the Schmitt trigger 210 is reached, for the high to low transition, signal C also goes up, thereby turning on transistor 206. However, transistor 206 turns on after transistor 207 turns off. Thus, no current flows in the feedback path to oppose the pull-down of the voltage on the long line 200 in the region 252. Therefore, in accordance with one embodiment of the present invention, the dynamic feedback enables high speed rise time, but does not effect the fall time on the device. The wider the hysteresis, the stronger the pull-up. In another embodiment, high speed fall times are implemented by providing strong pull-down transistors 115, 116 and 117 to pull the voltage on data conductor 200 down.

Figure 8:
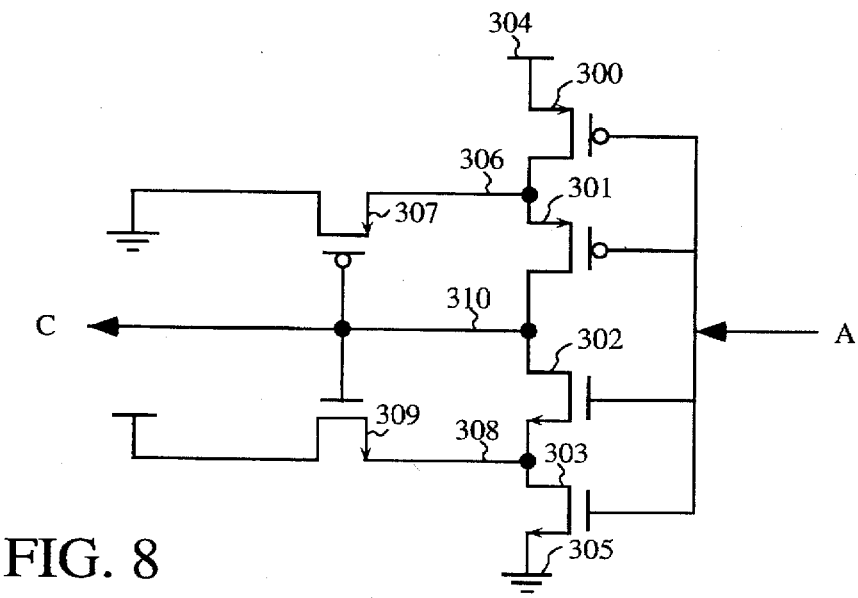
FIG. 8 is a circuit diagram for a Schmitt trigger inverter, such as that used in FIG. 6.

The Schmitt trigger 210, illustrated in greater detail in FIG. 8, includes p-channel transistor 300, p-channel transistor 301, n-channel transistor 302, and n-channel transistor 303, connected in series between the supply voltage 304 and ground 305. The drain of p-channel transistor 300 and the source of p-channel transistor 301 are coupled to node 306. Node 306 is connected to p-channel pass transistor 307, which has its opposite terminal coupled to ground. Similarly, the drain of n-channel transistor 303 is coupled to the source of n-channel transistor 302 at node 308. Node 308 is coupled to n-channel pass transistor 309 which has its opposite terminal coupled to the supply voltage. The drain of n-channel transistor 302 and the drain of p-channel transistor 301 are coupled to node 310. Node 310 is coupled to the gates of transistors 307 and 309, and supplies the output signal C of the Schmitt trigger (see also FIG. 6). The input signal A, is provided to the gates of the transistors 300-303 as illustrated in the figure. In one embodiment, transistors 300 and 301 are 10 microns wide and 1.7 microns long; transistors 302 and 303 are 10 microns wide and 5 microns long; transistor 307 is 30 microns wide and 0.8 microns long; and transistor 309 is 15 microns wide and 0.8 microns long. The trip points in the Schmitt trigger 210 are adjusted by changing the sizes of the transistors which is known in the art and therefore not described in detail herein. Note that the hysteresis enable provided by the inverting Schmitt trigger 210 and the n-channel transistor 206 is embodied using other circuits, as well. For example, in another embodiment, a non-inverting hysteresis circuit with a p-channel transistor is used.

Utilizing the feedback driver 125 with hysteresis enable of the present invention, the rise time on long lines in programmable gate arrays is substantially increased. For example, in a 24 CLB wide array, the propagation time from a first driver in the array, to an output could be as much as about 20-30 nanoseconds. Utilizing the dynamic feedback of the present invention in a similar configuration the rise time can be significantly reduced, typically by at least one-half.

In accordance with the present invention, the dynamic pull-up turns on only during transitional periods from the driven state to the target state, and at no other time, thereby providing low DC current consumption on the long line because of the smaller static pull-up circuits utilized. Furthermore, the metal used for the long line can be small because of the relatively smaller electro-migration requirements.

The present invention is scalable, because as the array size increases, the DC current required to maintain the long line in the resting state does not increase as much. Thus, one can increase the size (or numbers) of the dynamic pull-up while keeping the static pull-up constant.

In addition, the invention can be extended such that the dynamic pull-up is distributed to various regions of the long line. For example, in one embodiment, two dynamic pull-up circuits are provided, one circuit positioned at about one-quarter of the length of the long line, and another circuit at about three-quarters of the length of the long line. In another embodiment, a third dynamic pull-up is added at the mid-point of the long line, and so on depending on the length of the line, the load being driven, and the speed desired for the transitions.

Furthermore, the present invention is adaptable to a variety of speeds. A user can control the window during which the dynamic pull-up is enabled to increase or decrease the additional pull provided by that dynamic pull-up. This controls the transitional pull-up and pull-down speeds on the circuit.

As mentioned above, the present invention is particularly suited to long lines on field programmable gate array integrated circuits. However, it can be utilized in other integrated circuit devices in which a long data line is implemented on the chip.

The foregoing description of a preferred embodiment of the invention has been presented for purposes of illustration and description. It is not intended to be exhaustive or to limit the invention to the precise forms disclosed. Many modifications and variations will be apparent to practitioners skilled in this art. It is intended that the scope of the invention be defined by the following claims and their equivalents.

I claim:

1. A data transfer circuit, comprising:

a data conductor;

a circuit element providing a current path pulling the data conductor to a target voltage;

a plurality of data-in drivers connected to the data conductor which act in one state to pull the data conductor from the target voltage to a driven voltage, and act in another state to present high impedance to the data conductor; and a dynamic element which connects an additional current path to pull the data conductor to the target voltage during a voltage transition on the data conductor from the driver voltage to the target voltage, and which disconnects the additional current path when the transition is complete.

2. The circuit of claim 1, wherein the dynamic element comprises a feedback driver.

3. The circuit of claim 1, wherein the dynamic element comprises a feedback driver having an input connected to the data conductor, and a feedback enable circuit with hysteresis causing the feedback driver to be enabled when voltage of the data conductor is in transition from the driven voltage to the target voltage, and to be disabled when voltage on the data conductor is in transition from the target voltage to the driven voltage.

4. The circuit of claim 1, wherein the dynamic element comprises:

a p-channel transistor having a gate, a drain and a source, the source connected to a source of the target voltage;

an n-channel transistor having a gate, a drain and a source, the drain connected to the drain of the p-channel transistor, and the source connected by a current path to the data conductor;

an inverter, having an input connected to the data conductor and an output connected to the gate of the p-channel transistor; and a Schmitt trigger, having an input connected to the data conductor and an output connected to the gate of the n-channel transistor.

5. The circuit of claim 4, wherein the inverter has a trip point less than one-half of the target voltage minus the driven voltage, and the Schmitt trigger has a trip point for transitions from the driven voltage to the target voltage more than one-half of the target voltage minus the driven voltage.

6. A data transfer circuit in a programmable logic device having a set of configurable logic blocks, comprising:

a data conductor;

a circuit element providing a current path pulling the data conductor to a target voltage;

a plurality of data-in drivers, having inputs connected to configurable logic blocks in the set and outputs connected to the data conductor, which act in one state to pull the data conductor from the target voltage to a lower voltage, and act in another state to present high impedance to the data conductor; and a dynamic element which connects an additional current path to pull the data conductor to the target voltage during voltage transitions on the data conductor from the lower voltage to the target voltage, and which disconnects the additional current path when the transition is complete.

7. The circuit of claim 6, wherein the dynamic element comprises a feedback driver enabled only during transitions from the lower voltage to the target voltage.

8. The circuit of claim 6, wherein the dynamic element comprises a feedback driver having an input connected to the data conductor, and a feedback enable circuit with hysteresis causing the feedback driver to be enabled when voltage of the data conductor is in transition from the lower voltage to the target voltage, and to be disabled when voltage on the data conductor is in transition from the target voltage to the lower voltage.

9. The circuit of claim 6, wherein the dynamic element comprises:

a p-channel transistor having a gate, a drain and a source, the drain connected to a source of the target voltage;

an n-channel transistor having a gate, a drain and a source, the drain connected to the source of the p-channel transistor, and the source connected by a current path to the data conductor;

an inverter, having an input connected to the data conductor and an output connected to the gate of the p-channel transistor; and a Schmitt trigger, having an input connected to the data line and an output to the gate of the n-channel transistor.

10. The circuit of claim 9, wherein the inverter has a trip point less than one-half of the target voltage minus the lower voltage, and the Schmitt trigger has a trip point for transitions from the lower voltage to the target voltage more than one-half of the target voltage minus the lower voltage.

11. A pull-up circuit for a data line, comprising:

a resistive element connected between the data line and a source of a supply voltage;

a first transistor having a gate, a drain and a source, the source connected to the source of the supply voltage;

a second transistor having a gate, a drain and a source, the drain connected to the drain of the first transistor, and the source connected by a current path to the data line;

an inverter, having an input connected to the data line and an output connected to the gate of the first transistor; and a Schmitt trigger, having an input connected to the data line and an output connected to the gate of the second transistor.

12. The pull-up circuit of claim 11, further comprising means for pulling the data line from the supply voltage to a lower voltage, and wherein the inverter has a trip point less than one-half of the supply voltage minus the lower voltage, and the Schmitt trigger has a trip point for transitions from the lower voltage to the supply voltage more than one-half of the supply voltage minus the lower voltage.

13. The pull-up circuit of claim 11, wherein the resistive element comprises a third transistor having a gate, a drain and a source, the drain connected to the source of the supply voltage, the source connected to the data line, and the gate coupled to a bias voltage source.

14. A data transfer circuit, comprising:

a data conductor;

a circuit element providing a current path pulling the data conductor to a target voltage;

a plurality of data-in drivers connected to the data conductor which act in one state to pull the data conductor from the target voltage to a driven voltage, and act in another state to present high impedance to the data conductor; and a dynamic element which connects an additional current path to pull the data conductor to the target voltage only during voltage transitions on the data conductor from the driven voltage to the target voltage, and which disconnects the additional current path otherwise.

15. A data transfer circuit in a programmable logic device having a set of configurable logic blocks, comprising:

a data conductor;

a circuit element providing a current path pulling the data conductor to a target voltage;

a plurality of data-in drivers, having inputs connected to configurable logic blocks in the set and outputs connected to the data conductor, which act in one state to pull the data conductor from the target voltage to a lower voltage, and act in another state to present high impedance to the data conductor; and a dynamic element which connects an additional current path to pull the data conductor to the target voltage only during voltage transitions on the data conductor from the lower voltage to the target voltage, and which disconnects the additional current path otherwise.

* * * * *